United States Patent
Yu et al.

(10) Patent No.: US 12,477,664 B2
(45) Date of Patent: Nov. 18, 2025

(54) DISPLAY APPARATUS FOR VEHICLE

(71) Applicant: HYUNDAI MOBIS CO., LTD., Seoul (KR)

(72) Inventors: Byung Mo Yu, Yongin-si (KR); Jun Seong Seo, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 762 days.

(21) Appl. No.: 17/806,781

(22) Filed: Jun. 14, 2022

(65) Prior Publication Data

US 2023/0217601 A1 Jul. 6, 2023

(30) Foreign Application Priority Data

Jan. 4, 2022 (KR) .......... 10-2022-0001213

(51) Int. Cl.
| | |
|---|---|
| H05K 5/00 | (2025.01) |
| B60K 35/10 | (2024.01) |
| B60K 35/22 | (2024.01) |
| B60K 35/29 | (2024.01) |
| B60K 35/53 | (2024.01) |
| H02K 7/116 | (2006.01) |
| H05K 5/02 | (2006.01) |

(52) U.S. Cl.
CPC ........... *H05K 5/0017* (2013.01); *B60K 35/10* (2024.01); *B60K 35/22* (2024.01); *B60K 35/29* (2024.01); *B60K 35/53* (2024.01); *H02K 7/116* (2013.01); *H05K 5/0217* (2013.01)

(58) Field of Classification Search
CPC ..... H05K 5/0017; H05K 5/0217; H05K 7/116

USPC .......................................................... 361/809
See application file for complete search history.

(56) References Cited

U.S. PATENT DOCUMENTS

| | | | |
|---|---|---|---|
| 2005/0249069 A1* | 11/2005 | Aoki | G11B 33/022 |
| 2007/0176891 A1* | 8/2007 | Sano | B60K 35/81 |
| | | | 345/156 |
| 2013/0026889 A1* | 1/2013 | Lee | F16M 11/046 |
| | | | 312/7.2 |
| 2014/0355235 A1 | 12/2014 | Kato | |
| 2015/0070771 A1 | 3/2015 | Jeon | |

(Continued)

FOREIGN PATENT DOCUMENTS

| | | |
|---|---|---|
| CN | 102897107 | 1/2013 |
| CN | 108016370 | 5/2018 |
| CN | 109383404 | 2/2019 |

(Continued)

OTHER PUBLICATIONS

English Language Abstract of DE 10-2020-116986 published Nov. 4, 2021.

(Continued)

*Primary Examiner* — Hung S. Bui
(74) *Attorney, Agent, or Firm* — DLA PIPER LLP US

(57) ABSTRACT

A display apparatus for a vehicle including a screen unit configured to output vehicle operation information and an image of each function, and a driving unit configured to adjust a position of the screen unit through a rotary pop-up. The range of exposure of a display area may be selectively adjusted through the adjustment of the position of the screen part by the driving part, and a predetermined image may be output according to the range of exposure of the display area.

9 Claims, 15 Drawing Sheets

(56) References Cited

U.S. PATENT DOCUMENTS

2019/0041652 A1    2/2019    Murayama et al.
2021/0221283 A1    7/2021    Yudelevich

FOREIGN PATENT DOCUMENTS

| | | |
|---|---|---|
| CN | 113485528 | 10/2021 |
| DE | 10-2020-116986 | 11/2021 |
| EP | 1 068 982 | 1/2001 |
| EP | 1884292 | 2/2008 |
| JP | H 10-038593 | 2/1998 |
| JP | 2008-230356 | 10/2008 |
| JP | 2021-020499 | 2/2021 |
| KR | 20000006466 | 4/2000 |
| KR | 10-0835809 | 6/2008 |
| KR | 2013-0012789 | 2/2013 |
| KR | 2013-0012793 | 2/2013 |
| KR | 2016-0083720 | 7/2016 |
| KR | 2021-0012020 | 2/2021 |
| KR | 2021-0083483 | 7/2021 |
| KR | 2021-0089489 | 7/2021 |
| WO | WO-2018045762 A1 * | 3/2018 .............. F24F 13/10 |

OTHER PUBLICATIONS

English Language Abstract fof JPH 10-038593 published Feb. 13, 1998.

English Language Abstract of JP 2008-230356 published Oct. 2, 2008.

English Language Abstract of KR 2016-0083720 published Jul. 12, 2016.

English Language Abstract of KR 2021-0083483 published Jul. 7, 2021.

Korean Office Action dated Oct. 16, 2023 issued in KR 10-2022-0001213.

Chinese Office Action dated Apr. 23, 2025 issued in CN 202210757078.2.

* cited by examiner

DISPLAY APPARATUS FOR VEHICLE

CROSS-REFERENCE TO RELATED APPLICATION

This application claims priority to and the benefit of Korean Patent Application No. 10-2022-0001213, filed on Jan. 4, 2022, the disclosure of which is incorporated herein by reference in its entirety.

BACKGROUND

Field of the Invention

The present disclosure relates to a display apparatus for a vehicle.

Discussion of Related Art

A display apparatus for a vehicle provides content matching a driving condition.

Recently, with the advancement of autonomous driving technology, development of infotainment functions in vehicles has been active, and for this, a large-scale display apparatus should be driven in a separate manner to secure a clear view.

One way to do this is to use a method of selectively exposing a display apparatus, but this is disadvantageous because it makes it impossible to check road guidance and basic information during driving in a state in which the display apparatus is hidden.

In particular, when a display apparatus is hidden to secure a clear view for a driver, manipulation of infotainment functions may be limited, which could actually distract the driver from driving.

SUMMARY OF THE INVENTION

To address the above-described problem, the present disclosure is directed to providing a display apparatus for a vehicle that is capable of selectively controlling exposure of a display area of a screen unit to secure convenience and safety.

Aspects of the present disclosure are not limited thereto and other aspects that are not described herein will be apparent to those of ordinary skill in the art from the following description.

A display apparatus for a vehicle according to an embodiment of the present disclosure includes a screen unit configured to output vehicle operation information and an image of each function, and a driving unit configured to adjust a position of the screen unit through a rotary pop-up.

A range of exposure of a display area may be selectively adjusted through the adjustment of the position of the screen unit by the driving unit, and a predetermined image may be output according to the range of exposure of the display area.

The driving unit may include an actuator, a rotation shaft configured to be rotated while connected to the actuator, a first pinion gear connected to one end of the rotation shaft to be rotated in connection with the rotation shaft, a first rack gear forming an upward inclined arch shape in a cockpit module of a vehicle, and engaged with the first pinion gear, a second pinion gear connected to another end of the rotation shaft to be rotated in connection with the rotation shaft, and a second rack gear engaged with the second pinion gear, the second rack gear being symmetrical to the first rack gear and spaced apart from the first rack gear.

The driving unit may further include a cover including the rotation shaft and the first and second pinion gears therein while connected to the screen unit.

A position of the cover may be adjusted in a path of the first and second rack gears, together with a position of the screen unit.

The actuator may include a housing located above the rotation shaft while connected to a rear surface of the screen unit, a driving motor located in the housing and having a drive shaft, a helical gear connected to the drive shaft to be rotated in connection with the drive shaft, and a spur gear including a first sawtooth configured to be rotated in connection with the helical gear, and a second sawtooth configured to be rotated in connection with the first sawtooth and connected to the rotation shaft.

The actuator may further include an opening switch configured to detect an open position of the screen unit, and located on an upper end of the housing, and a closing switch configured to detect a closed position of the screen unit, and located on a lower end of the housing.

The actuator may further include a magnet connected to the second sawtooth, and a magnet sensor configured to detect the number of rotations of the magnet, and located in a region of the housing.

The actuator may further include an opening switch configured to detect an open position of the screen unit, and located on an upper end of the housing, a closing switch configured to detect a closed position of the screen unit, and located on a lower end of the housing, a magnet connected to the second sawtooth, and a magnet sensor configured to detect the number of rotations of the magnet, and located in a region of the housing.

A display apparatus for a vehicle according to another embodiment of the present disclosure includes a screen unit configured to output a corresponding image according to a closed mode or an open mode, wherein some regions of the screen unit are exposed in the closed mode and all regions of the screen unit are exposed in the open mode; and a driving unit configured to adjust a position of the screen unit according to a mode through a rotary pop-up.

In this case, when a load is applied to a driving motor due to an external force during the adjustment of the position of the screen unit, the driving unit may control driving of the driving motor according to a measured current according to the load.

The screen unit may include hooks at a front side and a rear side thereof to be snap-fit-fastened with the cockpit module in a certain mode, thereby securing rigidity.

In the closed mode, the screen unit may output an image of only relatively simple information related to a vehicle speed, a traveling direction, and a sound source.

In the open mode, the screen unit may output an image of a combination of vehicle operation information and entertainment information through a plurality of graphical user interfaces (GUIs).

The display apparatus may further include a control unit configured to control driving of the driving unit according to a predetermined command or through manipulation of a switch.

A display apparatus for a vehicle according to another embodiment of the present disclosure includes a screen unit configured to output a corresponding image according to a closed mode or an open mode, wherein some regions of the screen unit are exposed in the closed mode and all regions of the screen unit are exposed in the open mode; and a driving unit configured to be rotated in the cockpit module according to a predetermined logic so as to adjust a position of the screen unit according to a mode.

A range of exposure of a display area may be selectively adjusted through the adjustment of the position of the screen unit by the driving unit, and a predetermined image may be output according to the range of exposure of the display area.

The driving unit may include an actuator with a drive shaft, a connecting rod configured to be connected between the drive shaft and the screen unit, and a hinge shaft configured to connect the drive shaft of the actuator and the connecting rod.

The hinge shaft may be fixed at predetermined angles to adjust a position of the screen unit.

The screen unit may include hooks at a front side and a rear side thereof to be snap-fit-fastened with the cockpit module in a certain mode, thereby securing rigidity.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
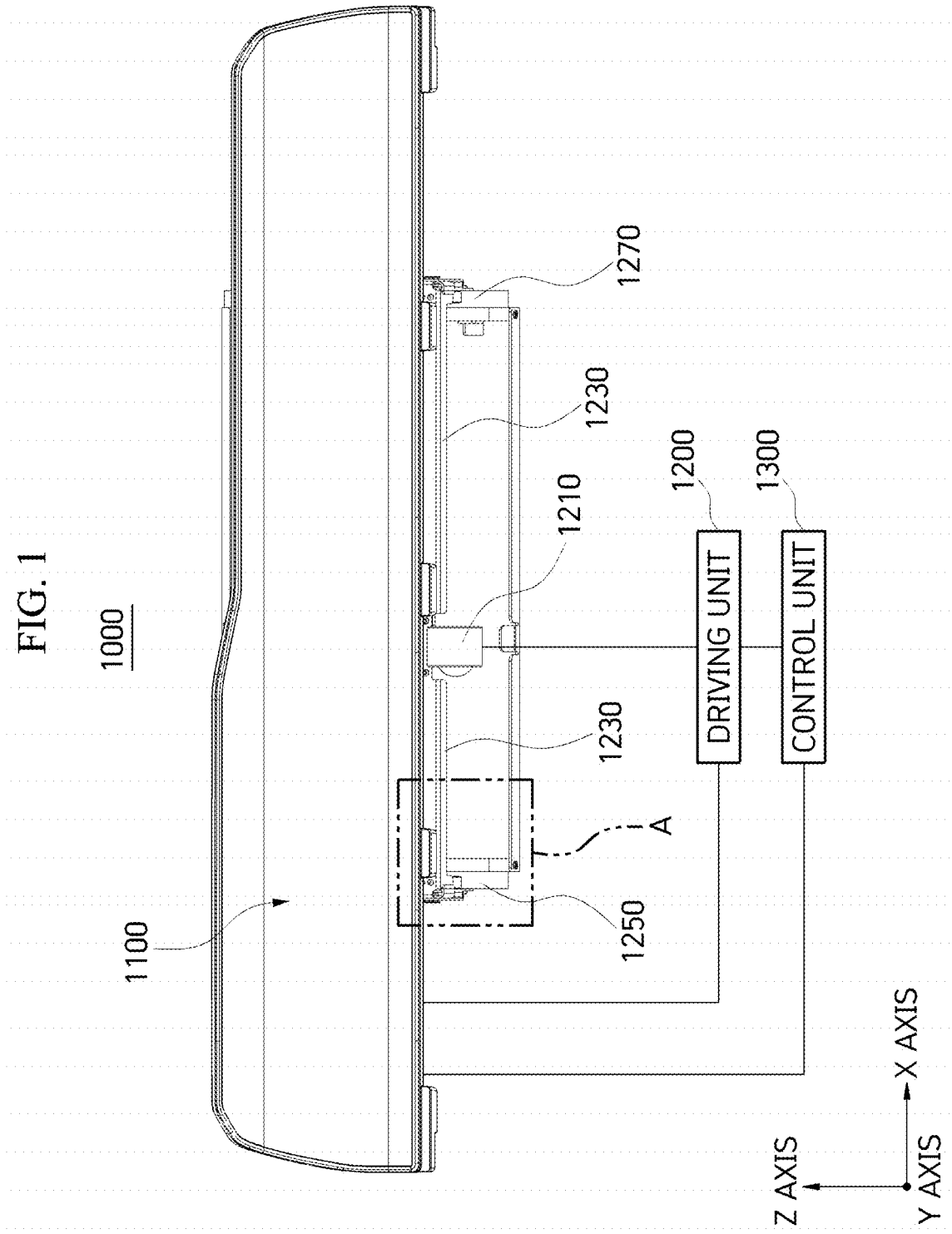
FIG. 1 is a front view schematically illustrating a display apparatus for a vehicle according to a first embodiment of the present disclosure.

Advantages and features of the present disclosure and methods of achieving them will be apparent from embodiments described in detail, in conjunction with the accompanying drawings. However, the present disclosure is not limited to the embodiments set forth herein and may be embodied in many different forms. Rather, these embodiments are provided so that this disclosure will be thorough and complete and will fully convey the concept of the present disclosure to those of ordinary skill in the art, and the scope of the present disclosure should be defined by the claims. The terminology used herein is for the purpose of describing embodiments only and is not intended to be limiting of the present disclosure. As used herein, singular forms are intended to include plural forms unless the context clearly indicates otherwise. As used herein, the term "comprise" or "comprising" specifies the presence of stated components, steps, operations and/or elements but does not preclude the presence or addition of one or more other components, steps, operations and/or elements. As used herein, the term "and/or" includes any and all combinations of one or more of the listed items.

Hereinafter, embodiments of the present disclosure will be described in detail with reference to the accompanying drawings.

Coordinate System Display

In the drawings of the present disclosure, X, Y, and Z axes represent a three-dimensional (3D) orthogonal coordinate system that displays the coordinates of a point or vector with respect to linear coordinate axes crossing each other vertically. For convenience of description, in the 3D orthogonal coordinate system, the X axis may be described as an axis facing a side of a vehicle in a width direction, the Y axis may be described as an axis facing a side of the vehicle in a longitudinal direction, and the Z axis may be described as an axis facing the top and bottom (ceiling and bottom) of the vehicle.

Each of an X-axis direction, a Y-direction and a Z-axis direction includes a positive direction and a negative direction.

A positive X-axis direction is a direction toward a lateral right side, and a negative X-axis direction is a direction toward a lateral left side.

A positive Y-axis direction is a direction toward the front of a vehicle in a longitudinal direction, and a negative Y-axis direction is a direction toward the rear of the vehicle in the longitudinal direction.

A positive Z-axis direction is a direction toward the ceiling of the vehicle, and a negative Z-axis direction is a direction toward the bottom of the vehicle.

For convenience of description, the positive and negative directions of each of the axes may be described on the basis of the same reference point or different reference points.

For example, in the present disclosure, the positive X-axis direction and the negative X-axis direction are a direction toward a lateral right side and a direction toward a lateral left side, respectively, but the directions may be determined with respect to a reference point that may vary according to a system.

First Embodiment (Basic Configuration)

FIG. 1 is a front view schematically illustrating a display apparatus for a vehicle according to a first embodiment of the present disclosure.

Referring to FIG. 1, a display apparatus 1000 for a vehicle according to the first embodiment of the present disclosure includes a screen unit 1100, a driving unit 1200, and a control unit 1300.

The screen unit 1100 outputs vehicle operation information and an image of each function. The screen unit 1100 is a large screen display, the basic size and performance of which exceed those of an existing display (not shown) that provides only vehicle operation information.

That is, when an autonomous mode that has come into widespread use owing to the development of technology is used, the screen unit 1100 may provide an occupant with more comfortable and convenient information (e.g., infotainment information, etc.) in the form of an image.

However, when an occupant does not use autonomous driving but has to drive a vehicle by himself or herself, a large screen of the screen unit 1100 may obstruct the occupant's field of view, thus causing a risk of a safety accident.

Therefore, the screen unit 1100 of the present disclosure may provide the convenience of a large screen in an autonomous driving mode (open mode), and control a degree of exposure of a screen to secure a driver's field of view in a driving mode (closed mode).

Therefore, the position of the screen unit 1100 is adjusted by the driving unit 1200 to selectively control a range of exposure of the display area, and a predetermined image may be output according to the range of exposure of the display area.

The driving unit 1200 adjusts a position of the screen unit 1100 through a rotary pop-up.

The control unit 1300 may control driving of the driving unit 1200 through a predetermined command or manipulation of a switch. The control unit 1300 may have a control logic limited to a corresponding function or may be an electronic control unit (ECU) of a vehicle.

First Embodiment (Operation Mechanism)

FIGS. 2 to 11 illustrate components of the display apparatus for a vehicle according to the first embodiment of the present disclosure and a relationship between operations of the components.

Figure 2:
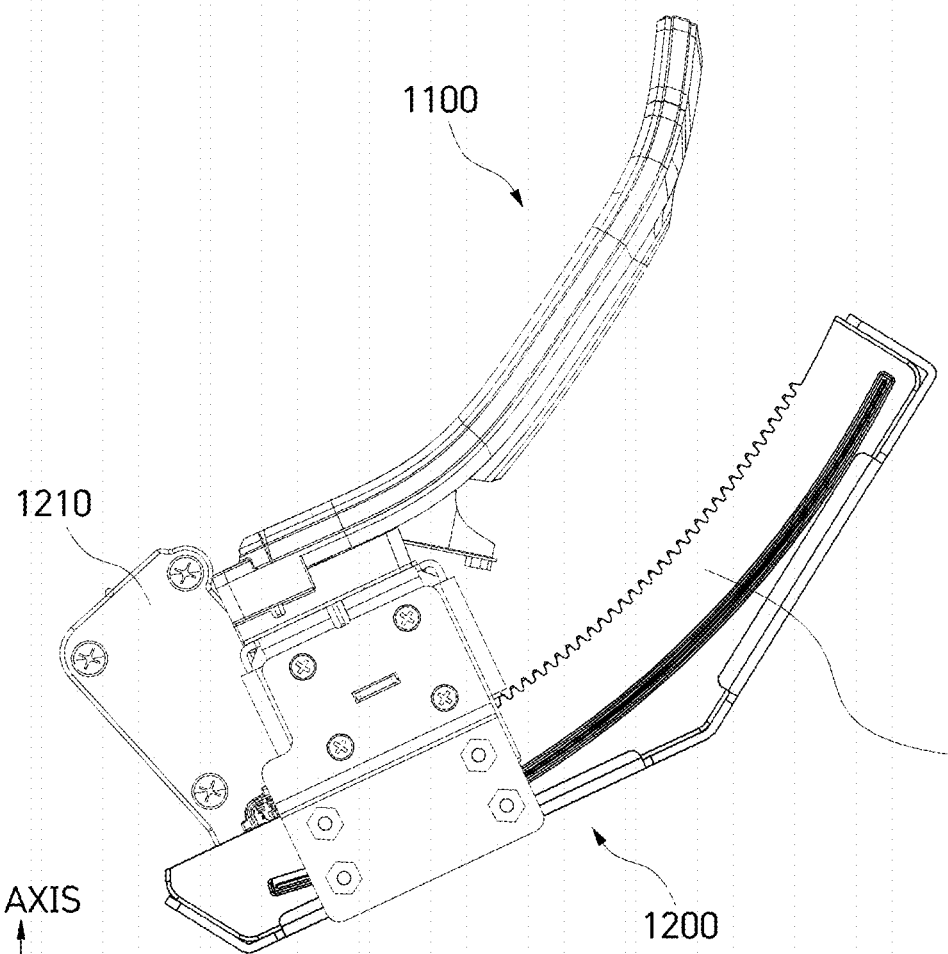
FIGS. 2 and 3 are side views schematically illustrating an operation mechanism of the display apparatus for a vehicle according to the first embodiment of the present disclosure.
Figure 3:
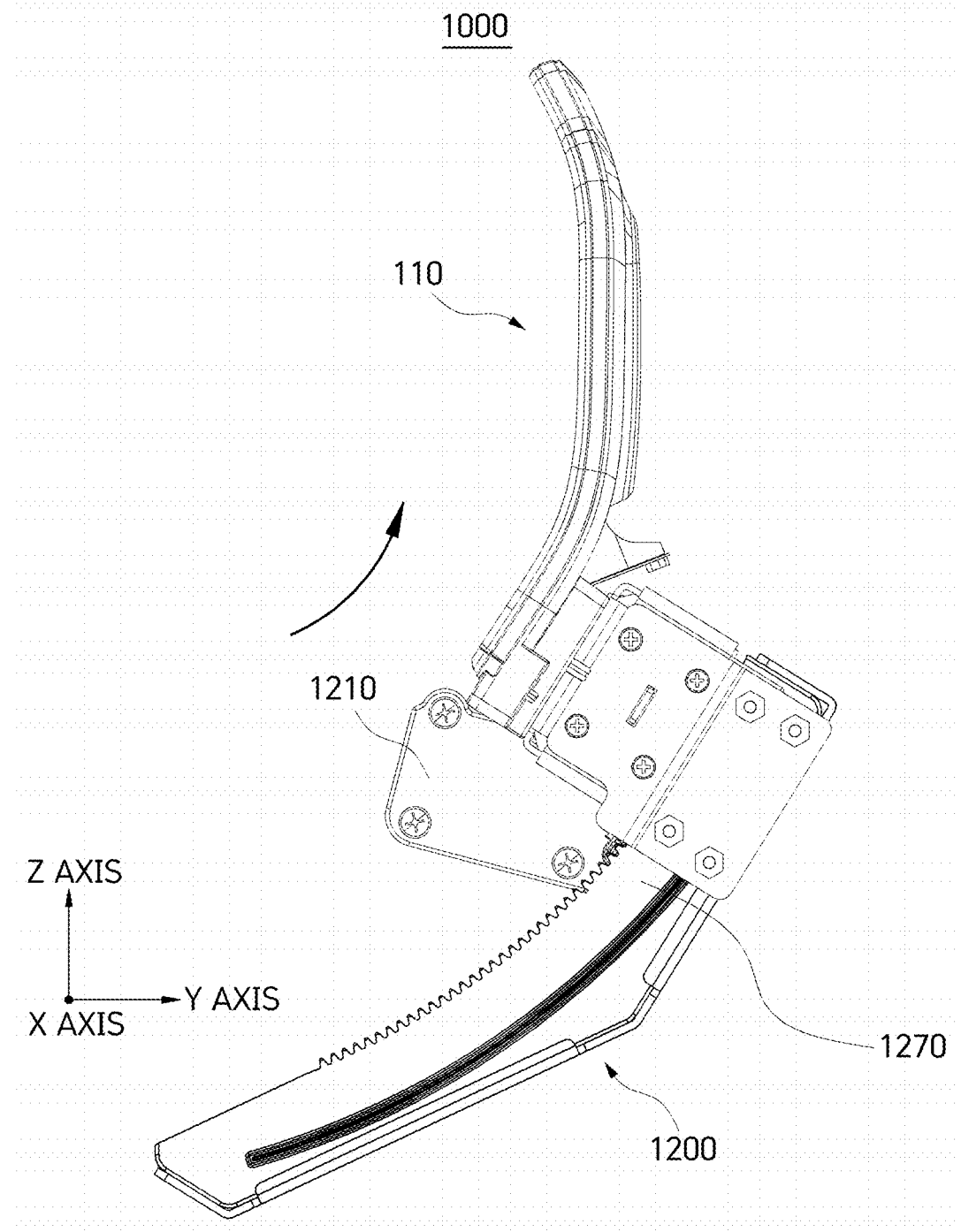

Referring to FIGS. 2 and 3, a position of the screen unit 1100 above a second rack gear 1270 may be adjusted by the driving unit 1200. Here, the screen unit 1100 may enter an open mode when the screen unit 1100 is moved in the positive Y-axis direction between a first rack gear 1250 of FIG. 1 and the second rack gear 1270 of FIGS. 2 and 3.

Conversely, the screen unit 1100 may enter a closed mode when the screen unit 1100 is moved in the negative Y-axis direction between the first rack gear 1250 of FIG. 1 and the second rack gear 1270 of FIGS. 2 and 3.

Figure 4:
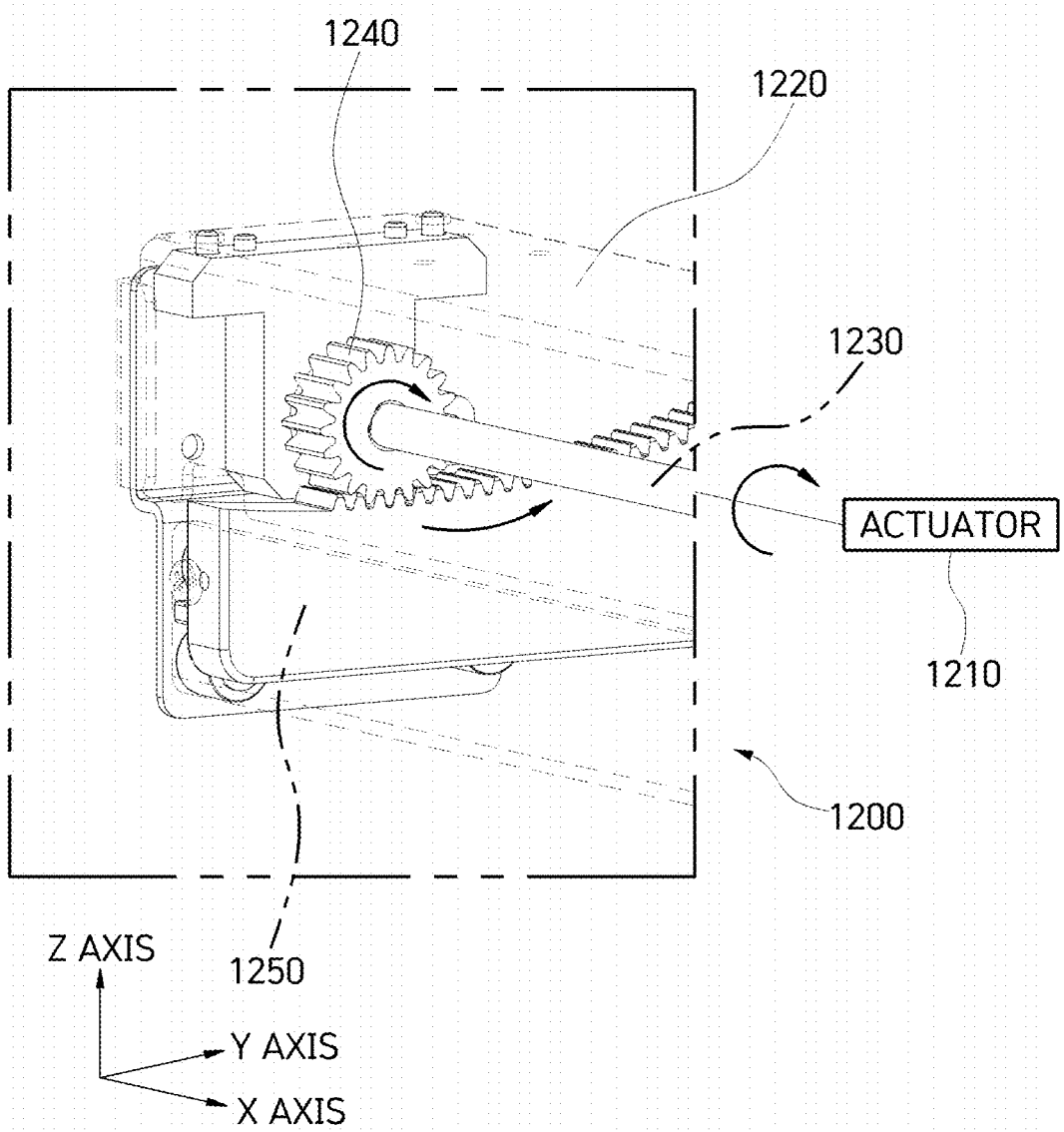
FIG. 4 is an enlarged view of a portion A of FIG. 1 for describing a relationship between operations of components.

Referring to FIG. 4, as a basic function, the driving unit 1200 transmits a driving force to a rotation shaft 1230 through an actuator 1210 to cause a first pinion gear 1240, which is connected to one end of the rotation shaft 1230, to be engaged with the first rack gear 1250 while rotating in connection with the rotation shaft 1230.

Therefore, the rotation shaft 1230 rotates in a direction in which the driving force is transmitted from the actuator 1210, thus causing the first pinion gear 1240, which rotates in connection with the rotation shaft 120, to move while engaged with the first rack gear 1250.

When the first pinion gear 1240 rotates in the positive Y-axis direction, a cover 1220 connected to the screen unit 1100 of FIGS. 1 to 3 is moved in the positive Y-axis direction along a path of the first rack gear 1250.

Figure 5:
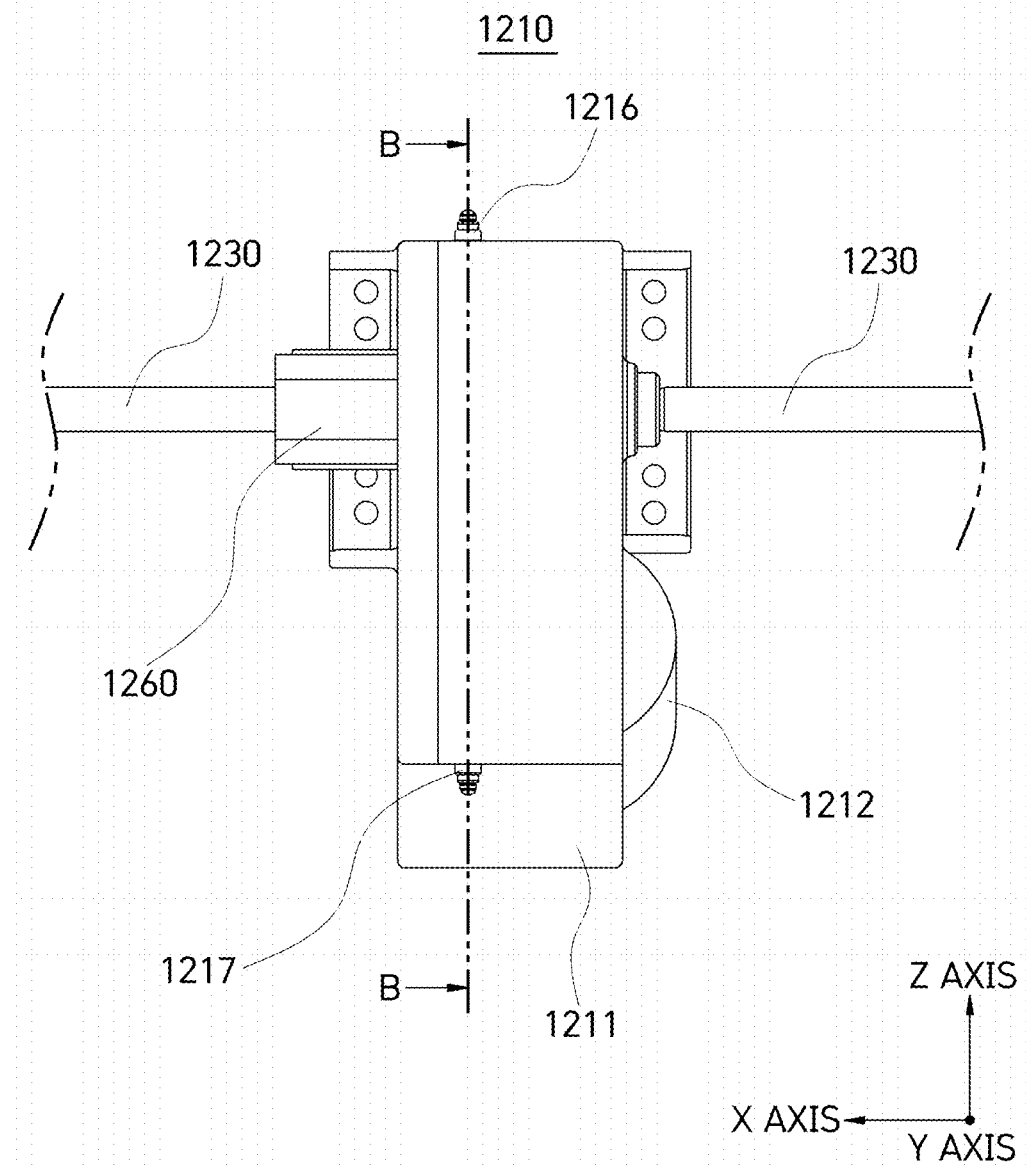
FIG. 5 is a schematic view of an actuator of the display apparatus for a vehicle according to the first embodiment of the present disclosure.
Figure 6:
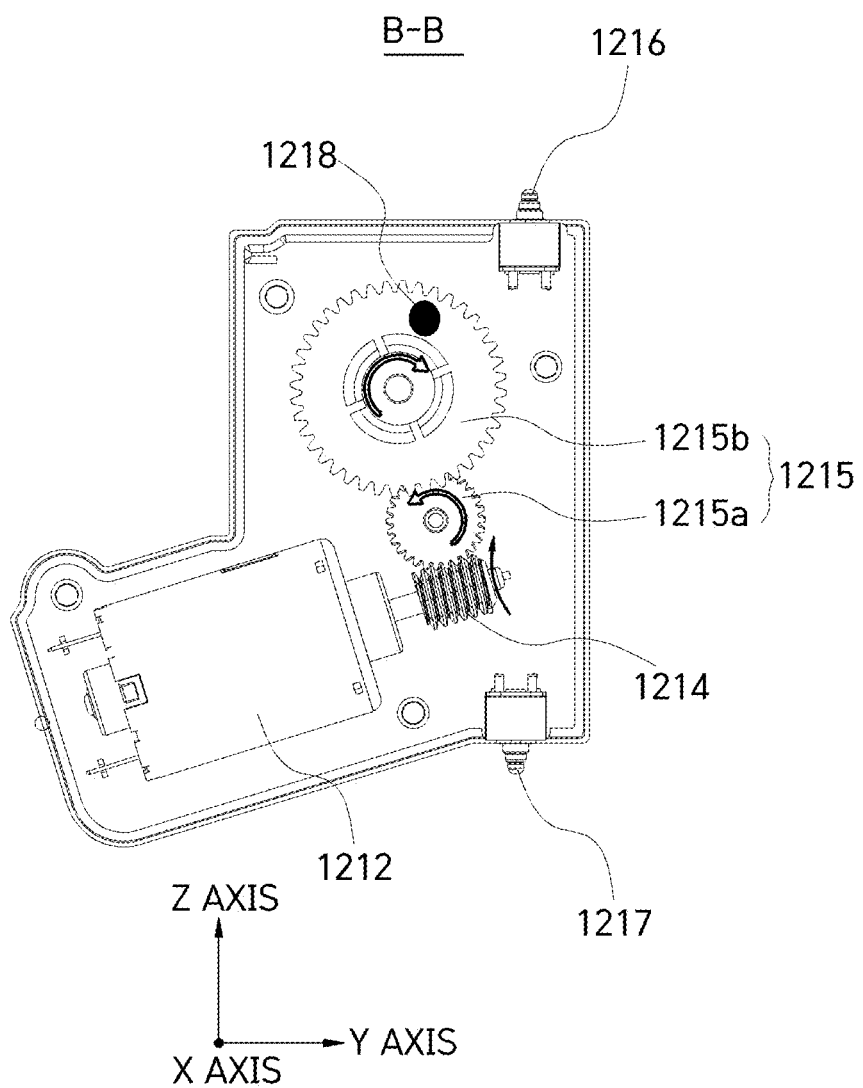
FIG. 6 is a cross-sectional view taken along line B-B of FIG. 5.

Referring to FIGS. 5 and 6, the actuator 1210 includes a housing 1211, a driving motor 1212, a helical gear 1214, a spur gear 1215, an opening switch 1216, and a closing switch 1217.

The housing 1211 is located above the rotation shaft 1230 while connected to a rear surface of the screen unit 1100.

The driving motor 1212 is located in the housing 1211 and has a drive shaft 1213.

The helical gear 1214 is connected to the drive shaft 1213 to rotate in connection with the drive shaft 1213.

The spur gear 1215 includes a first sawtooth 1215a that rotates in connection with the helical gear 1214, and a second sawtooth 1215b that rotates in connection with the first sawtooth 1215a and that is connected to the rotation shaft 1230.

The opening switch 1216 is located on an upper end of the housing 1211 and detects an open position of the screen unit 1100.

The closing switch 1217 is located on a lower end of the housing 1211 and detects a closed position of the screen unit 1100.

The actuator 1210 may detect a current position of the screen unit 1100 through a magnet 1218 connected to the second sawtooth 1215b and a magnet sensor 1219 that is located in a region of the housing 1211 and that detects the number of rotations of the magnet 1218.

Figure 7:
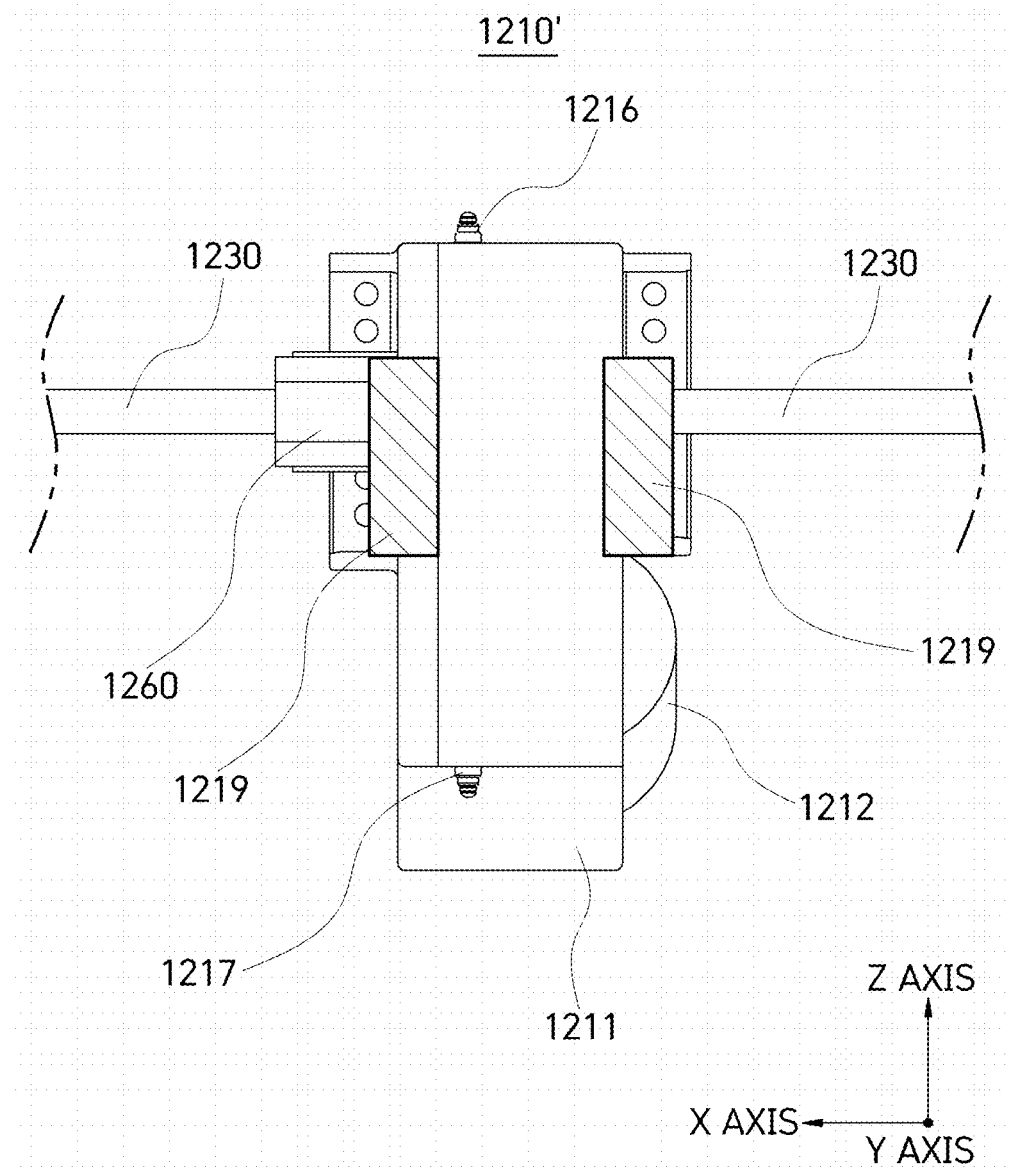
FIG. 7 is a schematic view of a modified example of the actuator of the display apparatus for a vehicle according to the first embodiment of the present disclosure.

As another example, as shown in FIG. 7, an actuator 1210' may include an opening switch 1216, a closing switch 1217, a magnet 1218, and a magnet sensor 1219 to induce stable driving.

When resetting is activated by a user through a separate switch (not shown) and/or a predetermined command, the driving unit 1200 moves the screen unit 1100 in a direction of a closed mode or an open mode.

Accordingly, the opening switch 1216, the closing switch 1217, the magnet 1218, and the magnet sensor 1219 may detect a current reset position of the screen unit 1100.

Figure 8:
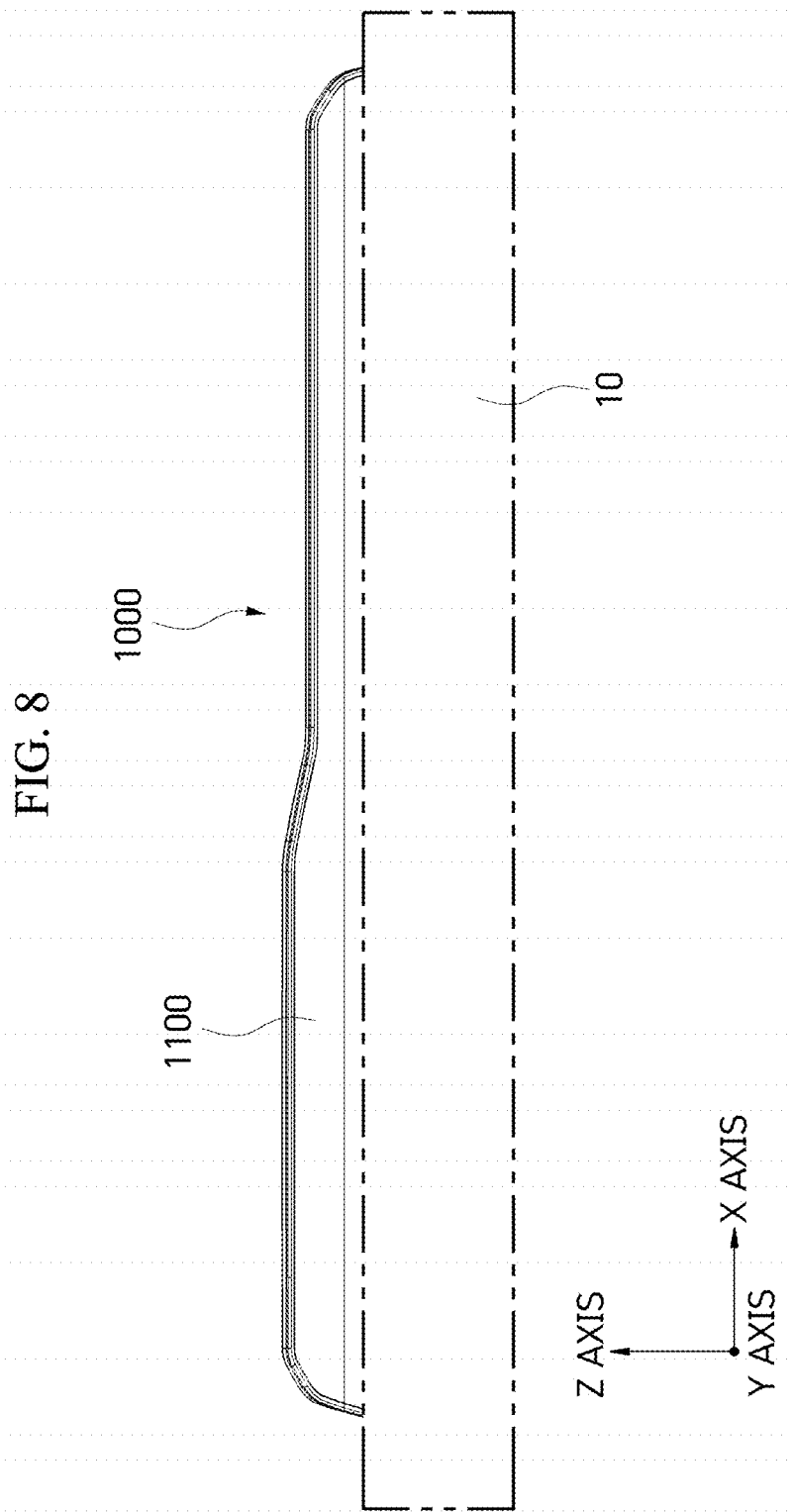
FIGS. 8 and 9 illustrate examples in which a screen unit of the display apparatus for a vehicle according to the first embodiment of the present disclosure is selectively exposed.

In FIG. 8, the screen unit 1100 is in the closed mode and thus outputs images of only relatively simple information relating to a vehicle speed, an operation direction, and sound sources.

Figure 9:
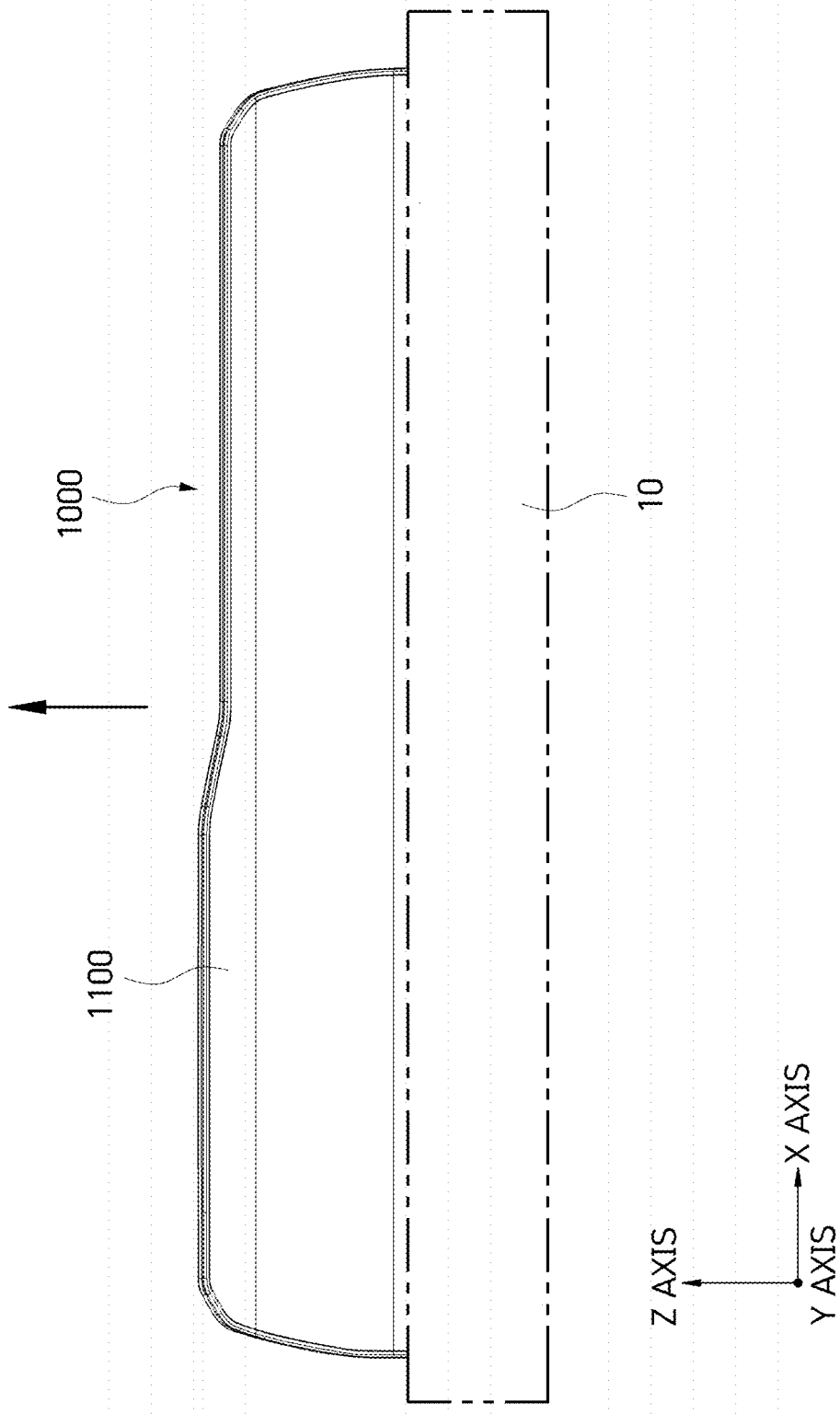

On the other hand, in FIG. 9, the screen unit 1100 is in the open mode and thus outputs an image of a combination of vehicle operation information and entertainment information through a plurality of graphical user interfaces (GUIs).

Figure 10:
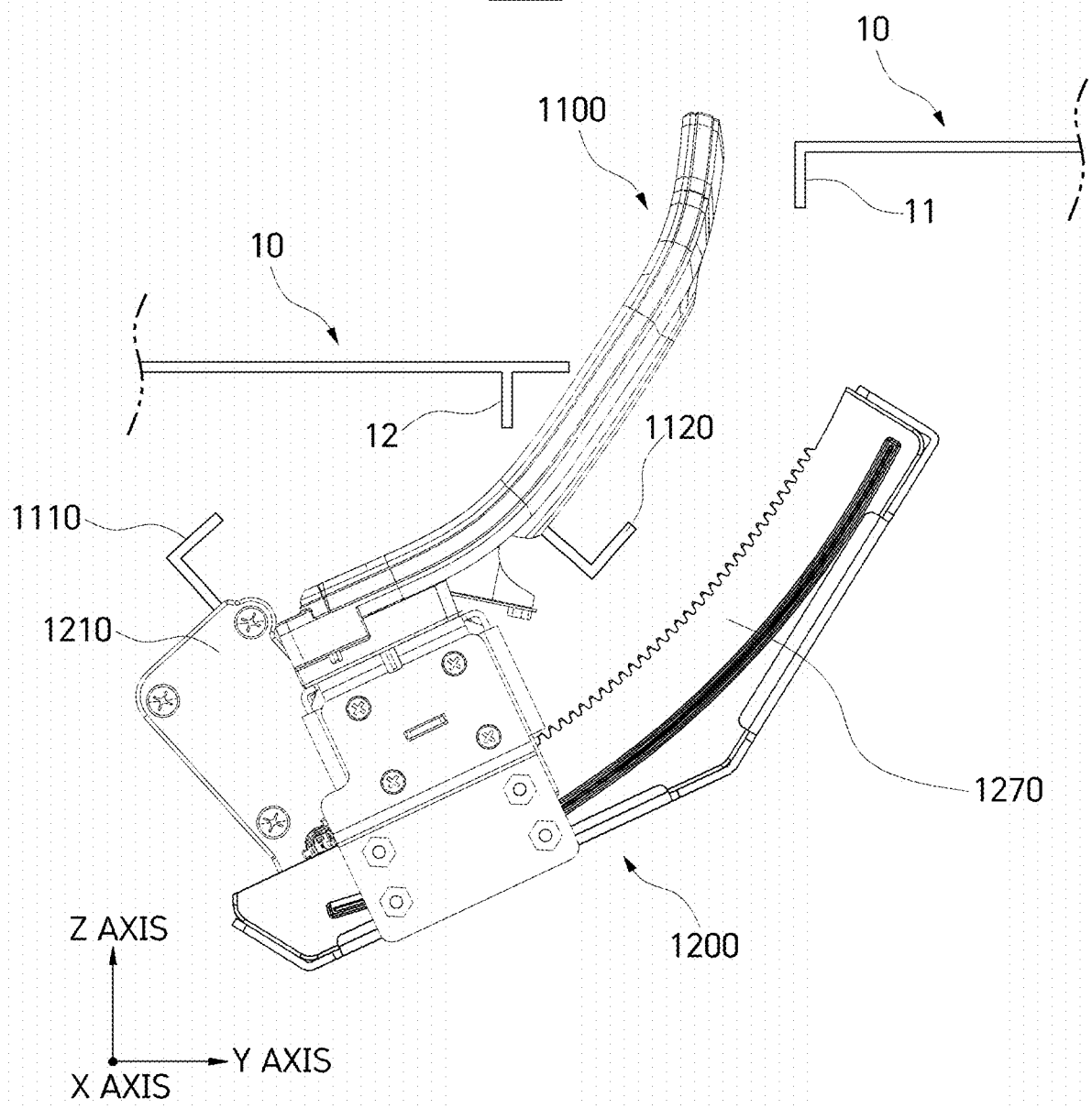
FIGS. 10 and 11 are side views schematically illustrating an operation mechanism of a display apparatus for a vehicle according to a modified example of the first embodiment of the present disclosure.
Figure 11:
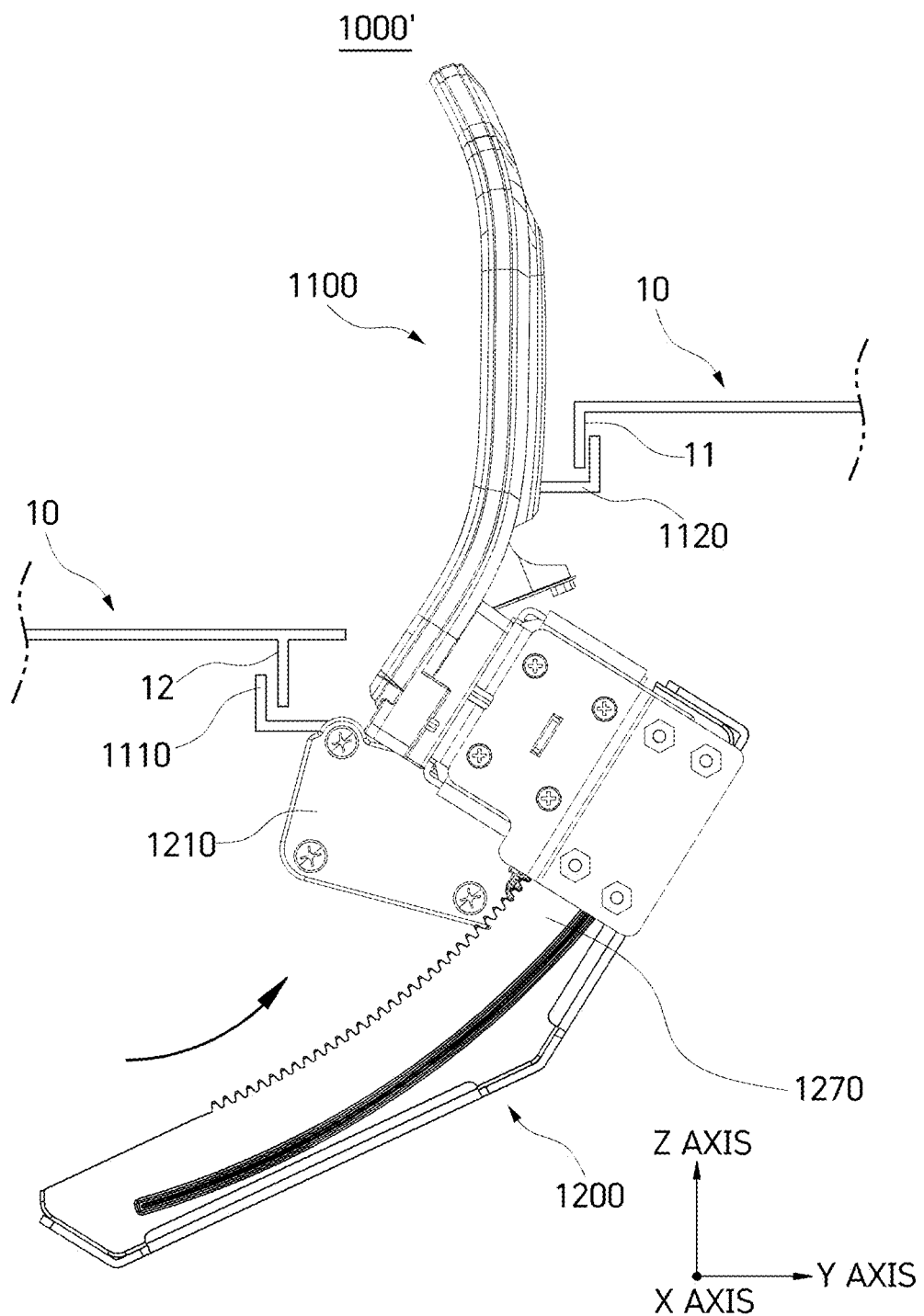

In FIGS. 10 and 11, a display apparatus 1000' for a vehicle includes a first hook 1110 and a second hook 1120 to ensure rigidity.

The first hook 1110 and the second hook 1120 may be respectively provided at a front side and rear side of the screen unit 1100 and be snap-fit-fastened with a cockpit module 10 when the screen unit 1100 is switched to the open mode.

For example, the first hook 1110 may be fixed onto a lower fixing end 12 of the cockpit module 10 and the second hook 1120 may be fixed onto an upper fixing end 11 of the cockpit module 10.

Second Embodiment (Basic Configuration and Operation Mechanism)

FIGS. 12 to 15 illustrate components of a display apparatus for a vehicle according to a second embodiment of the present disclosure and a relationship between operations of the components.

Figure 12:
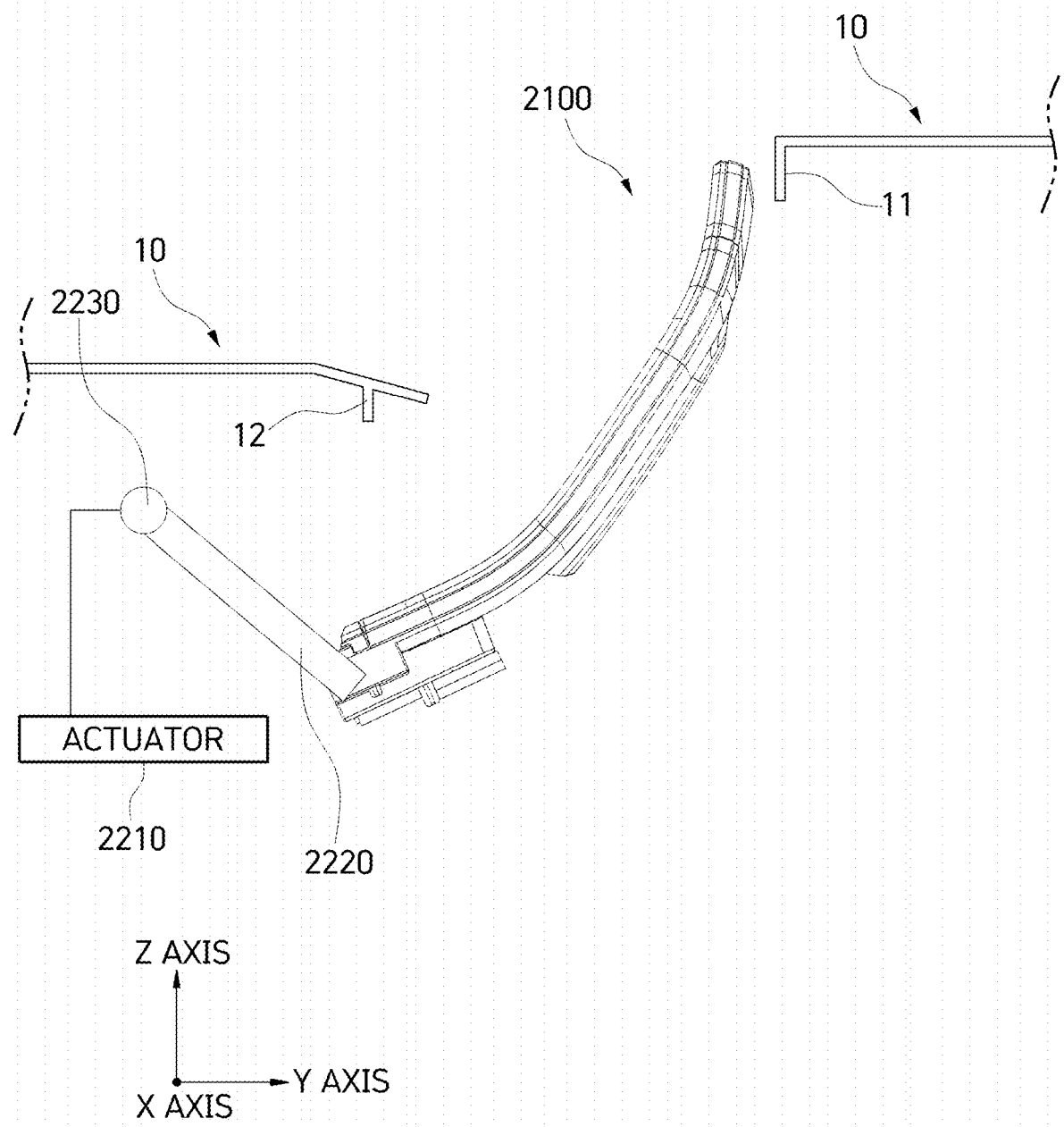
FIGS. 12 and 13 are side views schematically illustrating an operation mechanism of a display apparatus for a vehicle according to a second embodiment of the present disclosure.
Figure 13:
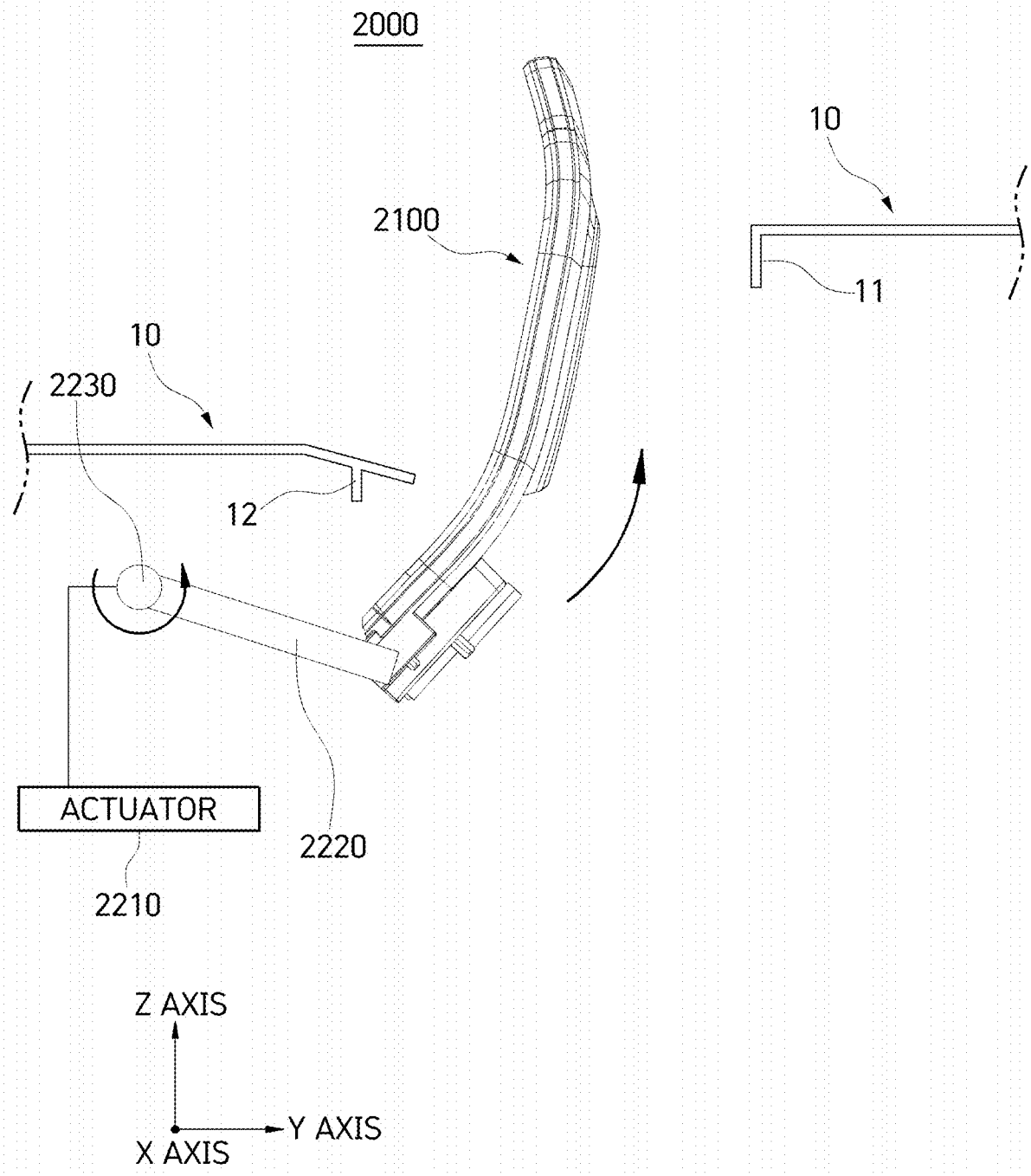
Figure 14:
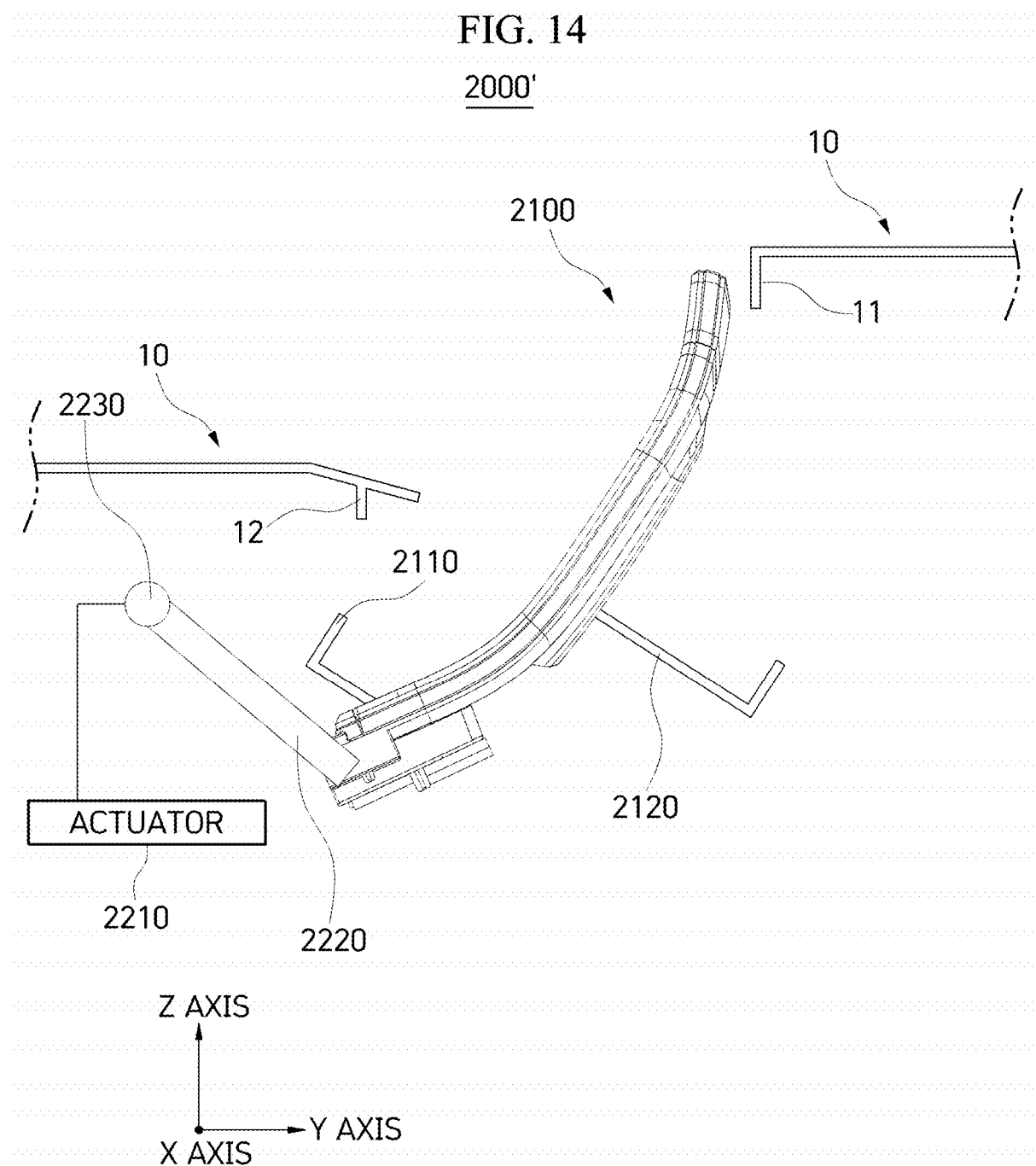
FIGS. 14 and 15 are side views schematically showing an operation mechanism of a display apparatus for a vehicle according to a modified example of the second embodiment of the present disclosure.
Figure 15:
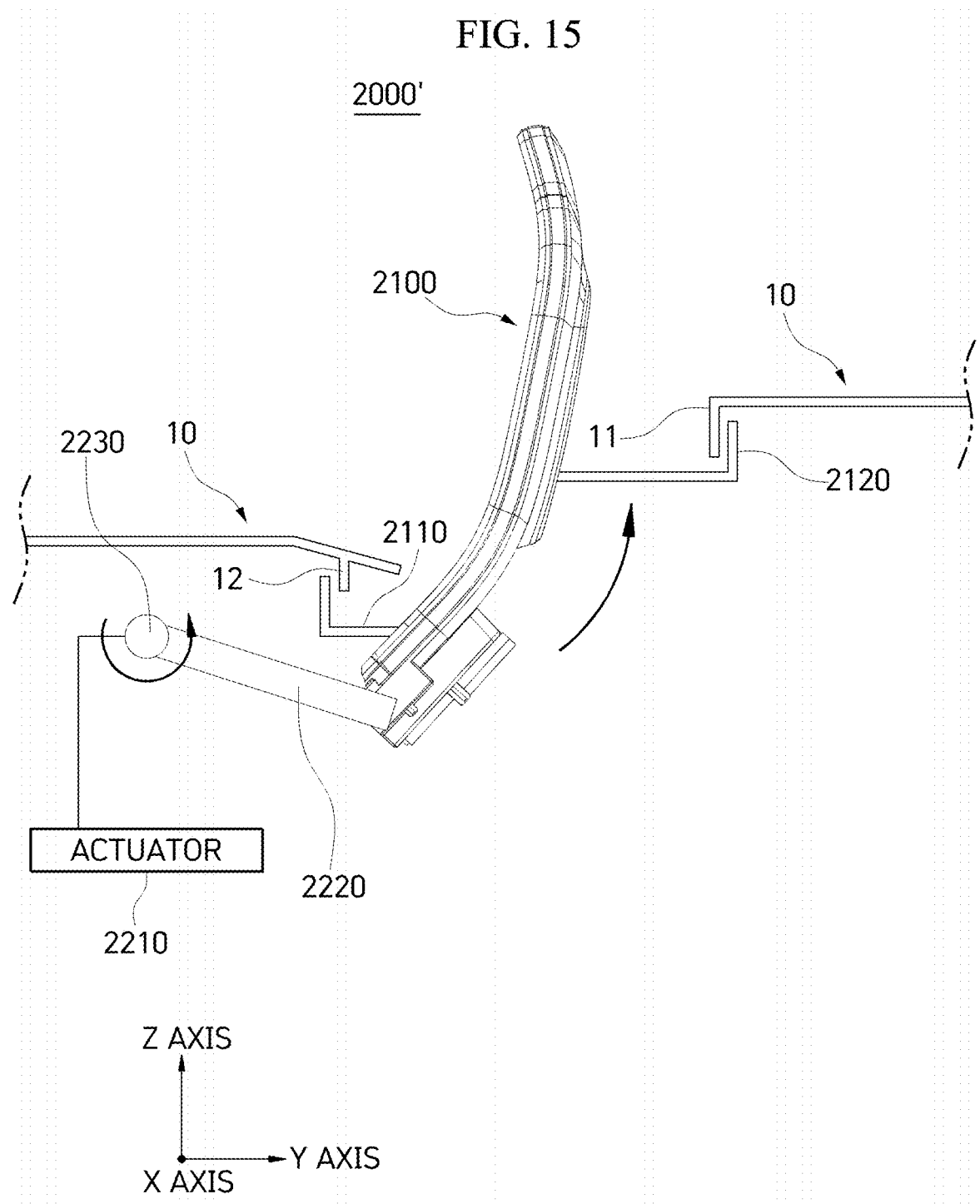

First, referring to FIGS. 12 and 13, a display apparatus 200 for a vehicle according to the second embodiment includes a screen unit 2100 and a driving unit 2200.

The screen unit 2100 outputs a corresponding image according to the closed mode in which some regions of the screen unit 2100 are exposed on a cockpit module 10 or the open mode in which all regions of the screen unit 2100 are exposed on the cockpit module 10.

In this case, the position of the screen unit 1100 is adjusted by the driving unit 2200 to selectively control a range of exposure of a display area, and a predetermined image may be output according to the range of exposure of the display area.

The driving unit 2200 may adjust a position of the screen unit 2100 according to a mode while rotating in the cockpit module 10 according to a predetermined logic.

The driving unit 2200 includes an actuator 2210, a connecting rod 2220, and a hinge shaft 2230.

The actuator 2210 has a drive shaft (not shown).

The connecting rod 2220 is connected between the drive shaft and the screen unit 2100.

The hinge shaft 2230 connects the drive shaft and the connecting rod 2220 of the actuator 2210.

The hinge shaft 2230 may be fixed at predetermined angles to adjust the position of the screen unit 2100.

The screen unit 2100 may further include a first hook 2110 and a second hook 2120 at front and rear sides thereof to be snap-fit-fastened with the cockpit module 10 in the open mode, thereby securing rigidity.

According to the present disclosure, a display apparatus for a vehicle is capable of selectively controlling exposure of a display area of a screen unit, thereby securing convenience and safety.

In particular, according to the present disclosure, different operation information and infotainment information can be provided according to a degree of exposure of the display area of the screen unit.

In addition, according to the present disclosure, durability can be maintained through a reinforcing structure using hooks when shaking occurs due to an external force.

The present disclosure is not limited to the above-described embodiments and may be implemented in various forms within an allowable range of the technical idea of the present disclosure.

What is claimed is:

1. A display apparatus for a vehicle, comprising:
   a screen unit configured to output vehicle operation information and an image of each function; and
   a driving unit configured to adjust a position of the screen unit through a rotary pop-up,
   wherein a range of exposure of a display area is selectively adjusted through the adjustment of the position of the screen unit, and a predetermined image is output according to the range of exposure of the display area,
   wherein the screen unit comprises hooks at a front side and a rear side thereof to be snap-fit-fastened with a cockpit module based on the range of exposure of the display area.

2. The display apparatus of claim 1, wherein the driving unit comprises:
   an actuator;
   a rotation shaft configured to be rotated while connected to the actuator;
   a first pinion gear connected to one end of the rotation shaft to be rotated in connection with the rotation shaft;
   a first rack gear forming an upward inclined arch shape in a cockpit module of the vehicle and engaged with the first pinion gear;
   a second pinion gear connected to another end of the rotation shaft to be rotated in connection with the rotation shaft; and
   a second rack gear engaged with the second pinion gear, the second rack gear being symmetrical to the first rack gear and spaced apart from the first rack gear.

3. The display apparatus of claim 1, wherein the driving unit further comprises a cover including the rotation shaft and the first and second pinion gears therein while connected to the screen unit.

4. The display apparatus of claim 3, wherein, a position of the cover is adjusted in a path of the first and second rack gears, together with a position of the screen unit.

5. The display apparatus of claim 1, wherein the actuator comprises:
   a housing located above the rotation shaft while connected to a rear surface of the screen unit;
   a driving motor located in the housing and having a drive shaft;
   a helical gear connected to the drive shaft to be rotated in connection with the drive shaft; and
   a spur gear connected to the rotation shaft and comprising a first sawtooth rotated in connection with the helical gear and a second sawtooth rotated in connection with the first sawtooth.

6. The display apparatus of claim 5, wherein the actuator further comprises:
   an opening switch located on an upper end of the housing and being configured to detect an open position of the screen unit; and
   a closing switch located on a lower end of the housing and being configured to detect a closed position of the screen unit.

7. The display apparatus of claim 5, wherein the actuator further comprises:
   a magnet connected to the second sawtooth; and
   a magnet sensor located in a region of the housing and being configured to detect a number of rotations of the magnet.

8. The display apparatus of claim 5, wherein the actuator further comprises:
   an opening switch located on an upper end of the housing and being configured to detect an open position of the screen unit;
   a closing switch located on a lower end of the housing and being configured to detect a closed position of the screen unit;
   a magnet connected to the second sawtooth; and
   a magnet sensor located in a region of the housing and being configured to detect a number of rotations of the magnet.

9. A display apparatus for a vehicle, comprising:
   a screen unit configured to output vehicle operation information and an image of each function; and
   a driving unit configured to adjust a position of the screen unit through a rotary pop-up,
   wherein a range of exposure of a display area is selectively adjusted through the adjustment of the position of the screen unit, and a predetermined image is output according to the range of exposure of the display area,
   wherein the driving unit comprises:
   an actuator;
   a rotation shaft configured to be rotated while connected to the actuator;
   a first pinion gear connected to one end of the rotation shaft to be rotated in connection with the rotation shaft;
   a first rack gear forming an upward inclined arch shape in a cockpit module of the vehicle and engaged with the first pinion gear;
   a second pinion gear connected to another end of the rotation shaft to be rotated in connection with the rotation shaft; and a second rack gear engaged with the second pinion gear, the second rack gear being symmetrical to the first rack gear and spaced apart from the first rack gear, wherein the first pinion gear and the second pinion gear are configured to rotate in a positive axis direction to drive the screen unit to move in the positive axis direction, to increase the range of exposure of the display area of the screen unit.

\* \* \* \* \*